United States Patent

Langham

[15] 3,675,146

[45] July 4, 1972

[54] DIGITAL VARIABLE FREQUENCY OSCILLATOR

[72] Inventor: J. Michael Langham, 16 W. 525 Lake Drive N., Clarendon Hills, Ill. 60514

[22] Filed: March 8, 1971

[21] Appl. No.: 121,837

[52] U.S. Cl. .................................. 331/1 R, 331/1 A, 331/2, 331/25, 331/55

[51] Int. Cl. .................................. H03b 3/04

[58] Field of Search .................. 331/1 R, 1 A, 2, 18, 25, 46, 331/48, 55, 56

[56] References Cited

UNITED STATES PATENTS 3,568,083 3/1971 Harzer .................................. 331/1 A

*Primary Examiner*—Roy Lake
*Assistant Examiner*—Siegfried H. Grimm
*Attorney*—E. Manning Giles, J. Patrick Cagney, Richard A. Zachar and Michael A. Kondzella

[57] ABSTRACT

A plural oscillator system with all the characteristics of an analog or variable frequency oscillator, but with the added capability of locking digitally to any frequency within its range. The system has two modes of operation, unlocked and locked. In the unlocked mode, the system employs a variable frequency oscillator together with a reference oscillator and counter to produce the system output and to log the period of the variable frequency oscillator into a memory. In the locked mode, the contents of the memory are held constant, and the variable frequency oscillator no longer drives the system output. Instead, the reference oscillator and counter are used in conjunction with a digital comparator to produce the system output with a frequency determined by the contents of the memory. Thus, the system in the locked mode operates as a digital oscillator at the frequency that the variable frequency oscillator operated before the mode change.

14 Claims, 2 Drawing Figures

INVENTOR
J. MICHAEL LANGHAM
BY J. Patrick Cagney
ATTORNEY

DIGITAL VARIABLE FREQUENCY OSCILLATOR

DESCRIPTION OF THE PRIOR ART

Heretofore, the most commonly used system for generating variable frequencies with digital accuracy utilized a digital oscillator (consisting of, for example, a crystal controlled oscillator, a digital counter and a thumbwheel switch) as master and a phase lock oscillator as slave. With the period of the desired output frequency set on the thumbwheel switch, the counter counts crystal oscillator pulses until reaching the same count as exists on the thumbwheel switch. Each time this occurs, the digital oscillator generates an output pulse and the counter is reset. Normally the phase lock oscillator is in step, so its output, which also serves as the system output, also generates an output pulse. Thus, the system maintains digital accuracy at a frequency determined by the thumbwheel switch. When the thumbwheel switch setting is changed, the digital oscillator instantly changes to the new frequency. Because the purpose of the phase lock oscillator is to keep the system output from making such abrupt changes in frequency, the properly designed phase lock oscillator causes the system output to change frequency smoothly in the direction of the new thumbwheel setting until phase lock is again achieved. Thus, the system accomplishes frequency synthesis with digital accuracy and with smooth changes.

There are two basic problems with this type of system. First, it is difficult to perform certain functions (such as, for example, synchronizing to another oscillator) using a thumbwheel switch. Second, a phase lock oscillator) tends not to perform well over the wide frequency range that digital oscillators usually operate. The phase lock oscillator, having lost lock because of a change in thumbwheel switch setting, often either will re-achieve acquisition (lock) accompanied by damped frequency oscillations or will not re-achieve acquisition at all.

SUMMARY OF THE INVENTION

In accordance with the present invention a system comprised of an analog or variable frequency oscillator and a digital oscillator is provided with a capability of varying frequency with digital accuracy but without the drawbacks of thumbwheel switches and phase lock loops. In addition, the system is capable of varying the frequency with precisely the same ease as a variable frequency oscillator; is economical and reliable and provides advantages not realized heretofore. The invention provides a plural oscillator apparatus by combining an analog variable frequency oscillator (VFO) with a digital oscillator in such a way that the VFO is the master oscillator and the digital oscillator the slave. Two embodiments are disclosed, each being operable either in the unlocked mode or the locked mode.

In the presently preferred embodiment, the VFO drives the system output in the unlocked mode, while a reference oscillator and counter monitor the period of the VFO and load the period information into a memory. On each pulse of the variable frequency oscillator, the system delivers an output pulse, the memory is updated, and the counter is reset.

In the locked mode, the memory is no longer updated and the VFO no longer drives the system output. System output is provided by a digital oscillator comprised of the reference oscillator and the counter that function in conjunction with a digital comparator to produce the system output with a frequency determined by the period information stored in the memory. Each time the comparator notes that the counter has reached the count that is stored in the memory, the system delivers an output pulse and the counter is reset. Thus, the system in the locked mode operates the digital oscillator as a slave at the frequency that the VFO operated before the mode change.

In a second embodiment, the analog or VFO oscillator and the digital oscillator are arranged as separate components. In the unlocked mode, the VFO is connected to supply updated period information to a memory and a digital oscillator drives the system output at a frequency that is a function of the VFO period currently held in the memory. Thus, as the frequency of the VFO varies, the system output produced by the digital oscillator varies correspondingly. In the locked mode, the digital oscillator drives the system output at a fixed frequency as determined by the VFO period information that is stored in the memory.

The organization and method of operation of the invention itself will best be understood from reading the descriptions of the embodiments of the invention in connection with the accompanying drawings.

DESCRIPTION OF FIGURE 1 EMBODIMENT

Figure 1:
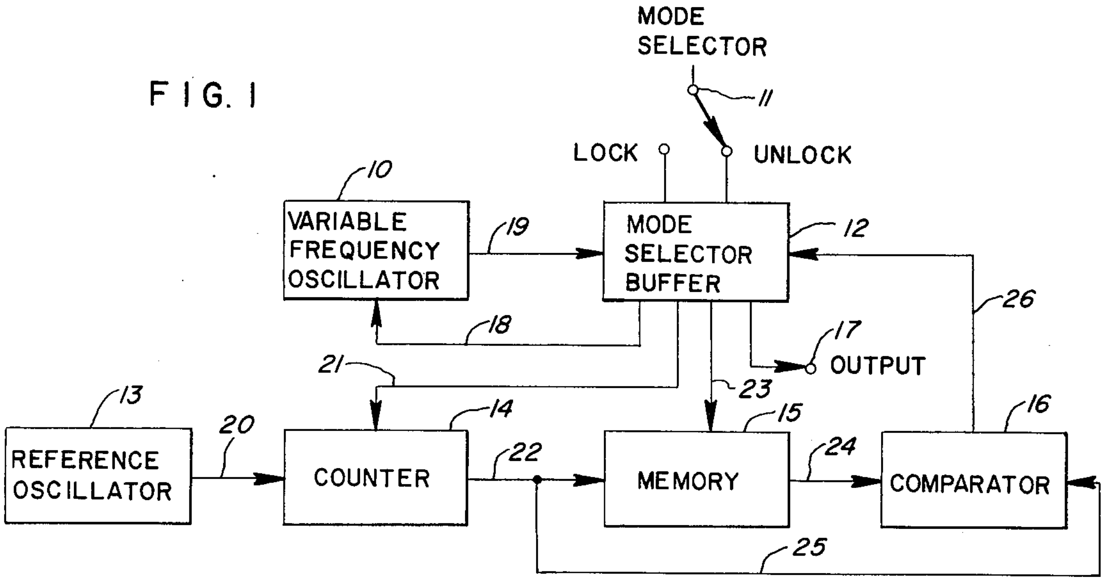
FIG. 1 depicts a schematic block diagram of the preferred embodiment of the digital variable frequency oscillator system of this invention in which the reference oscillator and counter are shared by the master and slave.

Referring to Fig. 1, there is shown an analog or variable frequency oscillator (VFO) 10, which may take the form of any VFO whose timing cycle may be stopped by applying a signal on lead 18. Assuming oscillator 10 has a resistor-capacitor timing circuit, applying a signal on lead 18 would cause the capacitor to be shunted. Oscillator 10 has an output lead 19 connected to a mode selector buffer 12. The mode selector buffer 12 functions primarily as a gating circuit to connect the conventional circuit modules of FIG. 1 in the proper configuration at the proper time, as determined by the position of mode selector 11. The mode selector 11, as illustrated herein, can be a simple toggle switch.

A reference oscillator 13 of a stable, high frequency type, such as a crystal-controlled oscillator, supplies pulses to a counter 14 on counter input lead 20. The counter 14 may be any digital counter capable of presenting a digital count indication on its output lead 22 and capable of being reset to a count of zero by applying a signal on lead 21. The contents of the counter 14 are dumped into a memory 15 when a signal is applied on lead 23 to the load terminal of the memory. The memory 15 may take the form of any digital memory compatible with the counter 14 and having an output physically separate from its input.

A comparator 16 compares the contents of the memory 15 on memory output lead 24 with the count in the counter 14 on lead 25. The comparator 16 can be any digital comparator compatible with the counter 14 and the memory 15 and having outputs for the two possible conditions: "inputs equal" and "inputs not equal." The inputs equal output of the comparator 16 is connected to the mode selector buffer 12 on lead 26.

With the mode selector 11 in the "unlock" position, the mode selector buffer 12 connects the output of the VFO 10 to the system output terminal 17, to the load terminal on the memory 15, and to the reset terminal on the counter 14. In this configuration, each pulse of the VFO 10 will produce a system output pulse, will load the count of the counter 14 into the memory 15, and will then reset the counter 14. Thus, the memory 15 will be constantly updated with a count that represents the period of the VFO 10, and the system will be controlled by the VFO 10 acting as a master determining the output frequency.

With the mode selector 11 in the "lock" position, the mode selector buffer 12 connects the reference oscillator 13, counter 14 and comparator 16 to act as a digital oscillator, with the output of the comparator 16 being connected to the system output 17 and to the reset terminal on the counter 14. In this configuration, the memory 15 is no longer updated but instead retains the period count at which the VFO 10 was operating just prior to the mode change. The digital oscillator functions as a slave to produce an output frequency as a function of the period of the VFO frequency just prior to locking. Each time the counter 14 reaches the count that is locked in the memory 15, the output of the comparator 16 signals the mode selector buffer 12 on lead 26 to deliver a system output pulse and to reset the counter 14. Thus, the system in the locked mode operates at a fixed frequency determined by count stored in the memory 15 and corresponding to the last period of the VFO output prior to the mode change.

In addition to making the proper connections between the conventional circuit modules, the mode selector buffer 12 serves to provide smooth transitions from the unlocked to locked mode and vice-versa. When the mode selector 11 is switched from unlock to lock, a delay means within the mode selector buffer 12 waits for the next pulse from VFO 10 before changing the system connections. This delay guarantees that the system will begin the locked mode with the counter 14 reset, assuring a smooth transition.

When the mode selector 11 is switched from lock to unlock, the mode selector buffer 12 first shunts the timing circuit of the VFO 10 by applying a signal to lead 18, then waits for the next output pulse before changing its system connections and before releasing the signal on lead 18. This guarantees that the system will begin the unlocked mode with the VFO 10 on the start of a timing cycle and with the counter 14 reset, assuring a smooth transition.

Typical values for the various components of this embodiment are as follows:

Variable Frequency Oscillator 10 — 0 to 1.0 Kilohertz frequency range, 100 nanoseconds pulse duration.

Reference oscillator 13 — 1.0-megahertz crystal oscillator, 100 nanoseconds pulse duration.

Counter 14 — 6-decade digital counter with binary coded decimal (BCD) outputs.

Memory 15 — 24-bit, latch-type, solid-state memory.

Comparator 16 — 24-bit digital comparator.

DESCRIPTION OF FIGURE 2 EMBODIMENT

Figure 2:
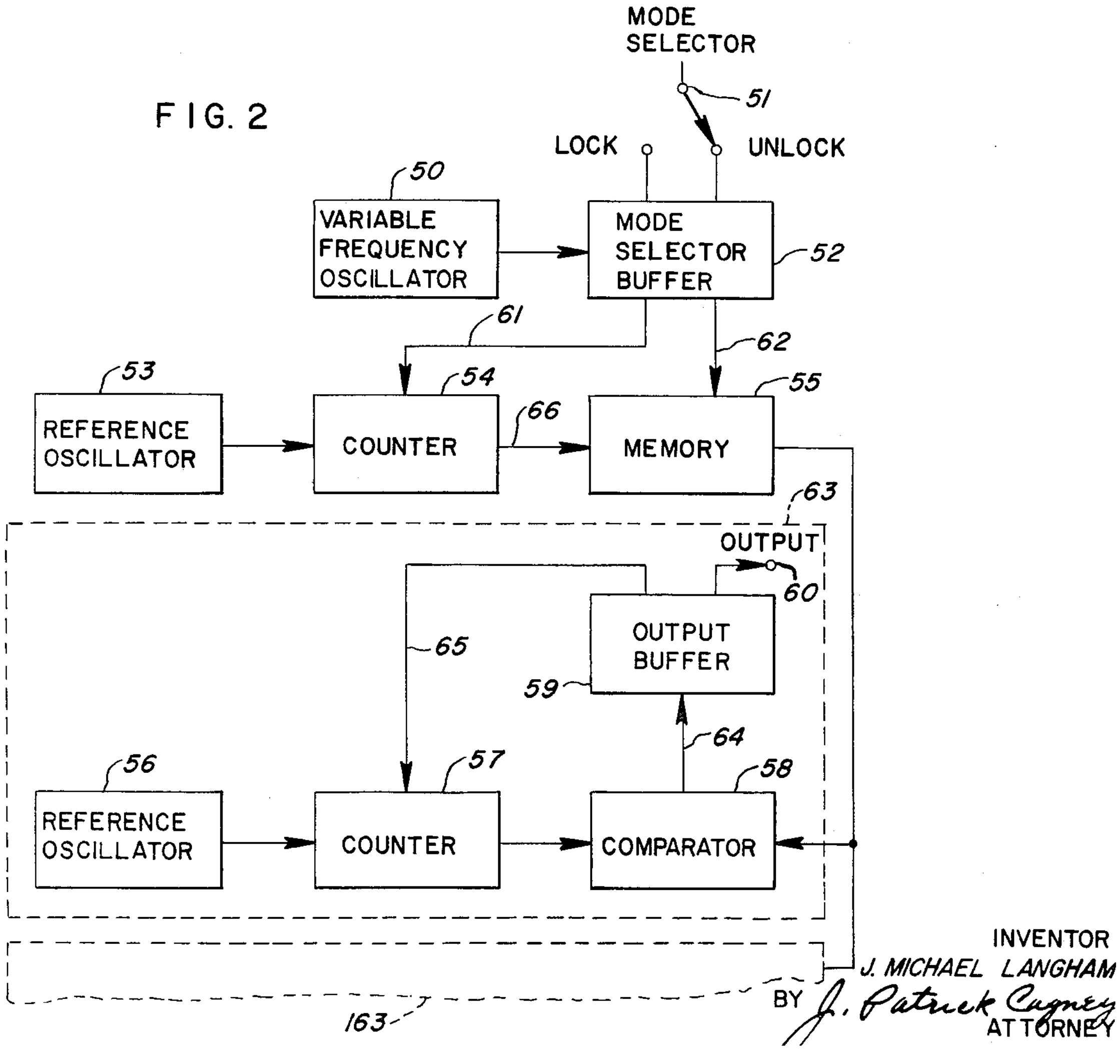
FIG. 2 depicts a schematic block diagram of another embodiment of this invention in which the components of the master and slave are physically separate.

Referring to FIG. 2, there is shown another embodiment of a plural oscillator system of this invention. A variable frequency oscillator 50, which may take the form of any VFO, is not subject to the timing circuit reset restriction as described for the VFO 10 of FIG. 1. The VFO 50 is connected to a mode selector buffer 52, which serves primarily as a gating circuit to establish the proper system connections at the proper time. The mode selector buffer 52 is controlled from a mode selector 51, which may be in all respects like the mode selector 11 of FIG. 1.

A reference oscillator 53, which may be in all respects like the reference oscillator 13 of FIG. 1, is used to supply pulses to a counter 54, which may be in all respects like the counter 14 of FIG. 1. The reset terminal of the counter 54 is connected to the mode selector buffer 52 by lead 61. The output of the counter 54 is connected by lead 66 to the input of memory 55, which may be similar in all respects to the memory 15 of FIG. 1. The load terminal of the memory 55 is connected to the mode selector buffer 52 by lead 62.

A reference oscillator 56, which may be similar in all respects to the reference oscillator 13 of FIG. 1, supplies pulses to a counter 57, which may be in all respects like the counter 14 of FIG. 1. The output of the counter 57 serves as input to a comparator 58, together with the output of memory 55. The comparator 58 can be any digital comparator compatible with the counter 57 and the memory 55 and having outputs for the three possible conditions: "less than," "equal to," and "greater than." The equal to and greater than outputs of the comparator 58 are tied together and connected to an output buffer 59 by lead 64. The output buffer 59 serves primarily as a gating circuit which produces a system output pulse at the output 60 and then resets the counter 57 by applying a signal to the counter reset lead 65. The four system blocks, reference oscillator 56, counter 57, comparator 58, and output buffer 59 function as a digital oscillator designated generally at 63 which operates as a slave oscillator in the system disclosed in FIG. 2.

With the mode selector 51 in the unlock position, the mode selector buffer 52 connects the output of the VFO 50 to the connection lead 61 to the reset terminal on the counter 54 and to the connection lead 62 of the load terminal on the memory 55. In this configuration, each pulse of the VFO 50 will load the count of the counter 54 into the memory 55, and will then reset the counter 54. Thus, the memory 55 will by repeatedly updated with a count that represents the period of the VFO 50. Concurrent with this happening, the counter 57 will count pulses from reference oscillator 56, and the comparator 58 will compare the count in the counter 57 with the contents of the memory 55. Each time the count in the counter 57 is equal to or greater than the contents of the memory 55, the comparator 58 will signal the output buffer 59, which will deliver a system output pulse to the output 60 and will reset the counter 57. The output 60 will, therefore, deliver one pulse for every M pulses of the reference oscillator 56, where M is the count in the memory 55 and represents the number of pulses of the reference oscillator 53 occurring between pulses of the VFO 50. Stated differently, the output 60, in the unlocked mode, will produce pulses at a frequency directly proportional to the frequency of the VFO 50 which thus acts as a master determining the output frequency. The frequency ratio will be the same as the ratio of the frequency of the reference oscillator 56, to the reference oscillator 53. Thus, if reference oscillator 56 has the same frequency as reference oscillator 53, the system output frequency will be the same as the frequency of the VFO 50, as is the case in FIG. 1.

With the mode selector 51 in the lock position, the mode selector buffer 52 disconnects the output of the VFO 50 from the load terminal of the memory 55, freezing the contents of the memory 55 with the period count at which the VFO 50 was operating just prior to the mode change. The digital oscillator 63 of this system operates as a slave just as in the unlocked mode, except that the system output frequency will be fixed because the contents of the memory 55 are fixed. The system output frequency will be fixed at the same value that it had just prior to the locking.

In addition to making the proper connections between the system blocks, the mode selector buffer 52 serves to provide smooth transitions from the unlocked to locked mode and vice-versa. When the mode selector 51 is switched from unlock to lock, the mode selector buffer 52 instantly disconnects the VFO 50 from the load terminal on the memory 55. Smooth transition here is assured because the digital oscillator 63 operates independent of bad transitional counts in the counter 54. When the mode selector 51 is switched from lock to unlock, the mode selector buffer 52 waits for the next pulse from the VFO 50 before changing its connections, so that the first update of the memory 55 in the unlocked mode will be based on a fresh count in the counter 54, assuring a smooth transition.

The embodiment shown in FIG. 2 provides a digital variable frequency oscillator system like that in FIG. 1 except for two points: (1) in the unlocked mode, the system shown in FIG. 2 permits output operation at a frequency in direct proportion to, but not necessarily equal to that of the VFO 50, whereas the system shown in FIG. 1 permits output operation only at a frequency equal to that of the VFO 10; (2) the system shown in FIG. 2 can be extended by adding one or more digital oscillators of the same type as digital oscillator 63, permitting multiple outputs with frequencies all in ration to that of the VFO 50.

Typical values for the various components of this embodiment are as follows:

Reference Oscillator 56 of Digital Oscillator 63 — 1.5-megahertz crystal oscillator, 100 nanoseconds pulse duration.

Reference Oscillator of Digital Oscillator 163 — 2.0-megahertz crystal oscillator, 100 nanoseconds pulse duration.

Other component values are similar to those given for the FIG. 1 embodiment.

Thus, while preferred constructional features of the invention are embodied in the structure illustrated herein, it is to be understood that changes and variations may be made by those skilled in the art without departing from the spirit and scope of the appended claims.

What is claimed is:

1. A plural oscillator apparatus comprising an analog oscillator operating at a selected frequency, a digital oscillator, and means connecting said analog and digital oscillators to operate the analog oscillator as a master determining the selected frequency and to operate the digital oscillator as a slave to produce an output frequency as a function of the period of said selected frequency.

2. A plural oscillator apparatus as defined in claim 1 and wherein said digital oscillator includes a fixed frequency reference oscillator and a digital counter responsive to the reference oscillator and said means includes a memory and a mode selector buffer for selectively connecting said analog and digital oscillators in first and second modes of operation, said first mode of operation being characterized in that a count representative of the period of the frequency determined by the analog oscillator is repeatedly logged into the memory, and said second mode of operation being characterized in that the digital oscillator produces system output at a frequency that is a function of said period.

3. A plural oscillator apparatus as defined in claim 2 wherein in said first mode of operation said mode selector buffer applies successive output pulses from the analog oscillator both to said counter and to said memory to repeatedly store an updated count in the memory representative of the instantaneous frequency of the analog oscillator.

4. A plural oscillator apparatus as defined in claim 3 wherein, in said second mode of operation, said mode selector buffer connects a comparator to respond to said memory and to said counter to provide an output pulse to a system output terminal and to reset the counter each time the count in the counter reaches the count stored in the memory.

5. A plural oscillator apparatus as defined in claim 2 wherein, in said first mode of operation, said mode selector buffer applies successive output pulses from the analog oscillator both to said counter and to said memory to cause each such pulse to load the instantaneous count from the counter into the memory as a representation of the period of the instantaneous frequency of the analog oscillator and to reset the counter, said mode selector buffer also applying successive output pulses from the analog oscillator to a system output terminal.

6. A plural oscillator apparatus as defined in claim 4 wherein said mode selector buffer includes delay means for effecting transition from said first mode to said second mode concurrently with the output pulse from said analog oscillator to initiate said second mode when the counter is reset.

7. A plural oscillator apparatus as defined in claim 1 and wherein said means includes a memory and a mode selector buffer operable in a first mode to connect said analog oscillator to produce system output and to repeatedly update the memory to store a count representative of the period of the instantaneous frequency of said analog oscillator and operable in a second mode to connect said digital oscillator to produce system output as a function of the period last stored in the memory.

8. Plural oscillator apparatus as defined in claim 1 wherein said digital oscillator includes a reference oscillator, a counter and a comparator and said means includes a memory and a mode selector buffer operable in a first mode to connect said analog oscillator to produce system output and to actuate said memory and reset said counter for repeatedly updating the memory to store a count representative of the period of the instantaneous frequency of the analog oscillator and operable in a second mode to connect the comparator to respond to said memory and to said counter to produce system output and to reset said counter when the count in the counter reaches the count stored in the memory.

9. A plural oscillator apparatus as defined in claim 8 wherein said mode selector means includes means for synchronizing transition from said first mode to said second mode with reset of said counter.

10. A plural oscillator apparatus as defined in claim 1 and wherein said means includes a memory and a mode selector buffer operable in a first mode to connect said analog oscillator to repeatedly update the memory to store a count representative of the period of the instantaneous frequency of said analog oscillator and to connect the digital oscillator to the memory to produce system output as a function of the period count in said memory and operable in a second mode to retain the count last stored in the memory while continuing the operation of the digital oscillator.

11. A plural oscillator apparatus as defined in claim 1 and including a second digital oscillator connected to operate in parallel with the first named digital oscillator.

12. A plural oscillator apparatus as defined in claim 1 wherein said digital oscillator includes a first reference oscillator, a first counter and a comparator and said means includes a memory, a second reference oscillator, a second counter and a mode selector buffer operable in a first mode to connect said analog oscillator to actuate said memory and reset said second counter for repeatedly updating said memory to store a count representative of the period of the instantaneous frequency of the analog oscillator and to connect said comparator to respond to said memory and to said first counter to produce system output and to reset said first counter when the count in said first counter reaches the count stored in the memory and operable in a second mode to retain the count last stored in the memory while continuing the operation of the comparator.

13. A plural oscillator apparatus as defined in claim 12 and including a second digital oscillator connected to operate in parallel with the first named digital oscillator.

14. A method of providing oscillation at a selected frequency comprising generating a train of pulses at a fixed frequency, analog generating a train of pulses at a frequency substantially less than said fixed frequency, applying successive analog generated pulses to store a count of the fixed frequency pulses in accordance with the period defined by said successive analog generated pulses, generating a train of pulses at a fixed frequency, counting the last-named fixed frequency pulses, and producing an output pulse each time the count of the last-named fixed frequency pulses equals the stored count.

* * * * *